United States Patent
Du et al.

(10) Patent No.: US 11,444,001 B1
(45) Date of Patent: Sep. 13, 2022

(54) THERMOELECTRIC SEMICONDUCTOR DEVICE AND METHOD OF MAKING SAME

(71) Applicant: WESTERN DIGITAL TECHNOLOGIES, INC., San Jose, CA (US)

(72) Inventors: Jiandi Du, Shanghai (CN); Yazhou Zhang, Shanghai (CN); Binbin Zheng, Shanghai (CN); Sundarraj Chandran, Tirunelveli (IN); Wenbin Qu, Shanghai (CN); Chin-Tien Chiu, Taichung (TW)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/314,712

(22) Filed: May 7, 2021

(51) Int. Cl.
| | |
|---|---|
| *H01L 23/38* | (2006.01) |
| *H01L 25/065* | (2006.01) |
| *H01L 25/18* | (2006.01) |
| *H01L 25/00* | (2006.01) |

(52) U.S. Cl.
CPC .......... *H01L 23/38* (2013.01); *H01L 25/0652* (2013.01); *H01L 25/18* (2013.01); *H01L 25/50* (2013.01); *H01L 2225/06506* (2013.01); *H01L 2225/06562* (2013.01); *H01L 2225/06586* (2013.01); *H01L 2225/06589* (2013.01)

(58) Field of Classification Search
CPC ..... H01L 23/38; H01L 25/0652; H01L 25/18; H01L 25/50
See application file for complete search history.

(56) References Cited

U.S. PATENT DOCUMENTS

| | | | |
|---|---|---|---|
| 6,893,902 B2 | 5/2005 | Cordes et al. | |
| 8,546,835 B2 | 10/2013 | Park | |
| 10,103,083 B2 | 10/2018 | Koswatta et al. | |
| 2004/0155251 A1 | 8/2004 | Abramov et al. | |
| 2012/0019274 A1* | 1/2012 | Kinsley | G01R 31/2856 324/750.03 |
| 2018/0226322 A1* | 8/2018 | Choong | H01L 24/32 |
| 2021/0013119 A1* | 1/2021 | Verma | H01L 24/08 |
| 2022/0059740 A1* | 2/2022 | Hahn | H01L 33/56 |
| 2022/0173090 A1* | 6/2022 | Gomes | H01L 25/0652 |
| 2022/0181256 A1* | 6/2022 | Gomes | H01L 23/481 |

FOREIGN PATENT DOCUMENTS

| | | |
|---|---|---|
| CN | 107180805 | 9/2017 |
| CN | 109818531 | 5/2019 |
| KR | 20140110412 | 9/2014 |

* cited by examiner

*Primary Examiner* — Thao P Le
(74) *Attorney, Agent, or Firm* — Vierra Magen Marcus LLP

(57) ABSTRACT

A thermoelectric semiconductor device includes a heat dissipating semiconductor module and a stack of flash memory dies mounted on a substrate. The heat dissipating module comprises a first semiconductor die such as a controller, and a second semiconductor die such as a thermoelectric semiconductor die to cool the first semiconductor die during operation. The thermoelectric semiconductor die may be mounted to the controller die at the wafer level.

20 Claims, 9 Drawing Sheets

THERMOELECTRIC SEMICONDUCTOR DEVICE AND METHOD OF MAKING SAME

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid-state drives.

While many varied packaging configurations are known, flash memory semiconductor devices may in general be assembled as system-in-a-package (SIP) or multichip modules (MCM), where a plurality of semiconductor memory dies are mounted and interconnected to an upper surface of a small footprint substrate, together with a controller die such as an ASIC.

Current semiconductor packages may operate using a high speed PCIe interface standard. Current and next generation semiconductor packages also operate using high power and at high frequencies. All of these factors cause semiconductor packages, and in particular controller dies, to generate large amounts of heat. This heat can cause die failure, as well as premature aging of semiconductor dies. It is therefore desirable to reduce the operating temperature of current and future generation semiconductor packages.

DETAILED DESCRIPTION

Figure 1:
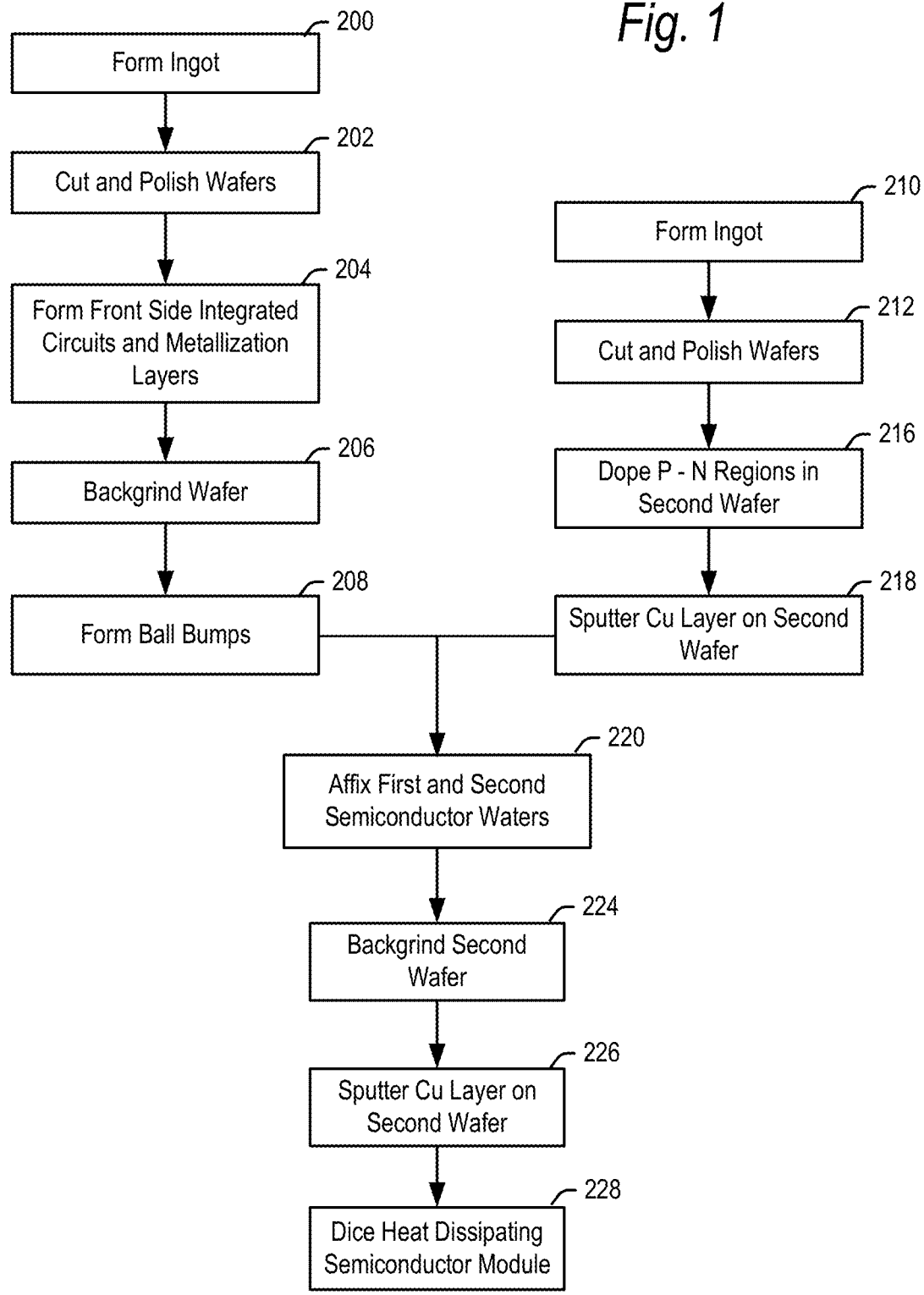
FIG. 1 is a flowchart for forming a heat dissipating semiconductor module according to embodiments of the present technology.

The present technology will now be described with reference to the figures, which in embodiments, relate to a thermoelectric semiconductor device including a heat dissipating semiconductor module. In embodiments, the thermoelectric semiconductor device includes a stack of flash memory dies and a heat dissipating module mounted on a substrate. The heat dissipating module comprises a first semiconductor die, which in embodiments may be a controller die, affixed to a second semiconductor die, which in embodiments may be a thermoelectric semiconductor die for cooling the first semiconductor die. The thermoelectric semiconductor die may be mounted to the controller die at the wafer level, with a bottom surface of the thermoelectric semiconductor die positioned at an interface between the dies.

The thermoelectric semiconductor die may be doped with p-n regions which result in a voltage potential across a thickness of the die upon a temperature gradient between top and bottom surfaces of the thermoelectric semiconductor die, and vice-versa. As a result, the thermoelectric semiconductor die may draw heat away from the controller die according to two different modes of operation. In the first operating mode, the thermoelectric semiconductor die draws heat away from the controller die according to the Seebeck effect. Here, the controller die heats up as a result of its operation, in turn heating the bottom surface of the thermoelectric semiconductor die and creating a temperature gradient between top and bottom surfaces of the second semiconductor die. This temperature gradient results in a voltage potential and current flow away from the bottom surface of the thermoelectric semiconductor die, thus drawing heat away from the controller die as thermal energy is converted into electrical energy at the interface between the dies. In a second mode of operation, the thermoelectric semiconductor die draws heat away from the first semiconductor die according to the Peltier effect, as a result of an applied voltage potential between the top and bottom surfaces of the second semiconductor die. This voltage potential and current flow results in a temperature gradient in the thermoelectric semiconductor die, with the cold side at the bottom surface of the thermoelectric semiconductor die. This cold surface at the interface between the dies draws heat from the controller die.

In embodiments described herein, the first semiconductor die is described as a controller die, such as an ASIC, for controlling communications between the thermoelectric semiconductor device and a host device. However, it is understood that the first semiconductor die to which the thermoelectric semiconductor die is affixed may be a variety of different semiconductor dies in further embodiments.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5%.

For purposes of this disclosure, a connection may be a direct connection or an indirect connection (e.g., via one or more other parts). In some cases, when a first element is referred to as being connected, affixed or coupled to a second element, the first and second elements may be directly connected, affixed or coupled to each other or indirectly connected, affixed or coupled to each other. When a first element is referred to as being directly connected, affixed or coupled to a second element, then there are no intervening elements between the first and second elements (other than the adhesive or metal used to connect, affix or couple the first and second elements).

An embodiment of the present technology will now be explained with reference to the flowcharts of FIGS. 1 and 9, and the views of FIGS. 2-8 and 10-19. FIGS. 1-8 describe a heat dissipating semiconductor module comprised of first and second semiconductor dies, and a method of fabricating same. FIGS. 9-19 describe a thermoelectric semiconductor device including the heat dissipating semiconductor module, and a method of fabricating same.

Referring initially to the flowchart of FIG. 1, a first semiconductor wafer 100 may start as an ingot of wafer material which may be formed in step 200. In one example, the ingot from which the first wafers 100 are formed may be monocrystalline silicon grown according to either a Czochralski (CZ) or floating zone (FZ) process. However, first wafer 100 may be formed of other materials and by other processes in further embodiments. In step 202, the first semiconductor wafer 100 may be cut from an ingot and polished on both the first major surface 102 (FIG. 2), and second major surface 104 (FIG. 6) opposite surface 102, to provide smooth surfaces. At this point during fabrication, semiconductor wafer 100 may be about 760 microns (μm).

In step 204, the first major surface 102 may undergo various processing steps to divide the first wafer 100 into a group of first semiconductor dies 108 (FIGS. 2 and 6), and to form integrated circuits of the respective first semiconductor dies 108 in the first major surface 102. In step 206, the second major surface of the first wafer 100 may be thinned in a backgrind process to its final thickness. The final thickness may for example be 25 μm to 50 μm, though the final thickness may be greater or lesser than that in further embodiments. Metal ball bumps 109 (FIG. 6) may be formed in step 208 on the second major surface 104 of the first wafer. The integrated circuits may be electrically coupled to the metal bump bonds 109 by metallization layers formed of metal interconnects and vias (not shown). The metal bump bonds 109 may be formed of gold by stud bumping, or using other metals and/or like processes. The bump bonds 109 may be formed in various patterns including rows of bump bonds 109 extending in a first direction (left/right in FIG. 6), and/or columns of bump bonds 109 extending in a second direction orthogonal to the first direction (into the page of FIG. 6). Surface 102 including the integrated circuits is also referred to herein as the active surface 102, and surface 104 is also referred to as the inactive surface.

In embodiments, the semiconductor dies 108 may for example be controller dies such as ASICs for controlling communications between the semiconductor device using a die 108 and a host device. However, as noted, dies 108 may be other types of dies in further embodiments. In one further example, the semiconductor dies 108 from first wafer 100 may be AI (artificial intelligence) semiconductor chips. Such chips may be used to implement artificial intelligence processes with respect to data stored in the memory die stack. It is also conceivable that dies 108 be flash memory dies, such as 2D NAND flash memory or 3D BiCS (Bit Cost Scaling), V-NAND or other 3D flash memory. Other types of dies are possible for dies 108. The number of semiconductor dies 108 shown on first wafer 100 in the figures is for illustrative purposes, and first wafer 100 may include more semiconductor dies 108 than are shown in further embodiments.

Before, after or in parallel with the fabrication of first wafer 100, a second wafer 110 may be processed in steps 210-218. The second semiconductor wafer 110 may start as an ingot of wafer material which may be formed in step 210. In one example, the ingot from which the second wafer 110 is formed may be monocrystalline silicon grown according to either a Czochralski (CZ) or floating zone (FZ) process. However, second wafer 110 may be formed of other materials and by other processes in further embodiments. In step 212, the second semiconductor wafer 110 may be cut from an ingot and polished on both the first major surface 112 (FIG. 2), and second major surface 114 (FIG. 4) opposite surface 112, to provide smooth surfaces. At this point during fabrication, semiconductor wafer 110 may be about 760 microns (μm).

Figure 3:
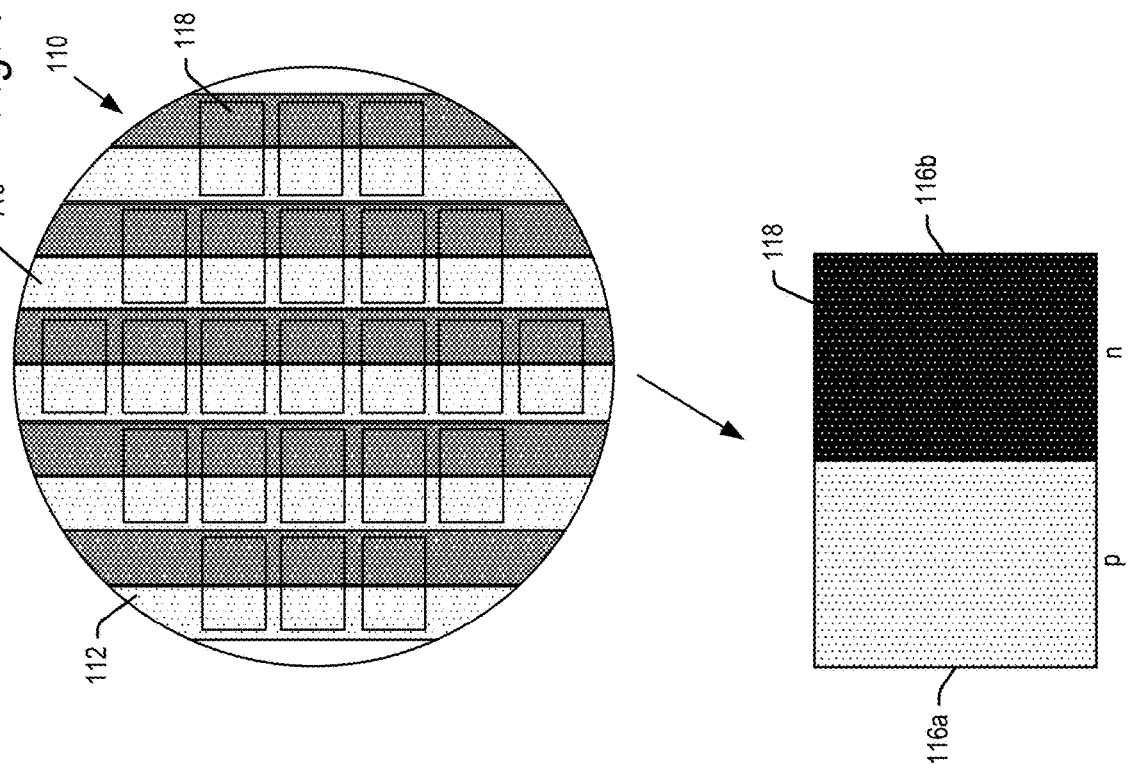
FIG. 3 is a front view of a semiconductor wafer showing a second group of semiconductor dies formed in and/or on a first major surface of the wafer.
Figure 2:
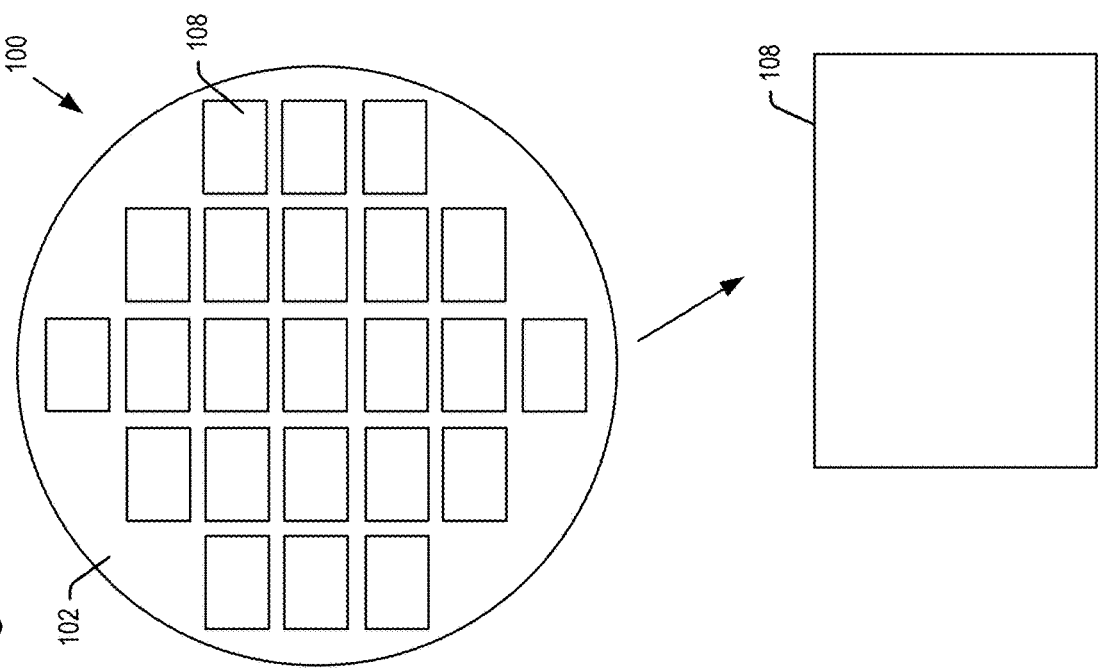
FIG. 2 is a front view of a semiconductor wafer showing a first group of semiconductor dies formed in and/or on a first major surface of the wafer.

In step 216, the second wafer 110 may undergo various processing steps to divide the second wafer 110 into a group of second semiconductor dies 118 (FIGS. 3-6), and to dope each of the second semiconductor dies into adjacent p-n charge-carrier regions 116. The second dies 118 may be doped by known doping techniques that introduce impurities into the second wafer 110 to change the adjacent regions 116 into differently charged p-n carriers. The regions 116 may be formed in columns as shown in FIG. 3. Alternatively, the doping of second wafer 110 may be limited to just those areas forming the second group of semiconductor dies 118.

Figure 4:
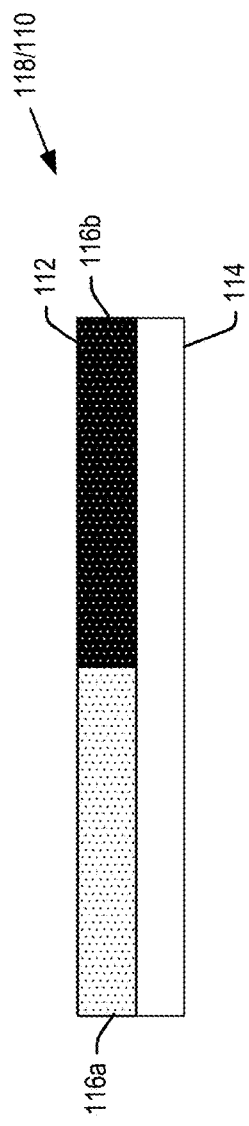
FIGS. 4-8 are edge views of the thermoelectric semiconductor die and heat dissipating semiconductor module at various stages of fabrication according to embodiments of the present technology.
Figure 5:
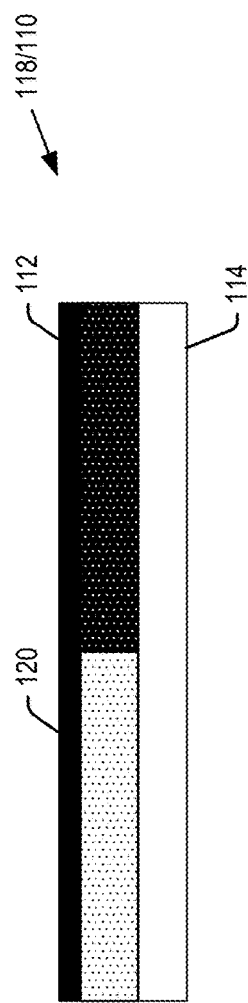

FIG. 4 is an edge view of a single die 118 from wafer 110. The view shows p-doped region 116a next to n-doped region 116b. The view shows the die 118 doped through a portion of its thickness between the first, or top, major surface 112 and the second, or bottom, major surface 114. In further embodiments, the dies 118 of second wafer 110 may be doped to lesser or greater thicknesses, including to full thickness of the second wafer 110. In step 218, a layer of copper 120, or other electrical and thermal conductor, may be sputtered onto the top major surface 112 of the dies 118 of second wafer 110 as shown in FIG. 5.

Figure 6:
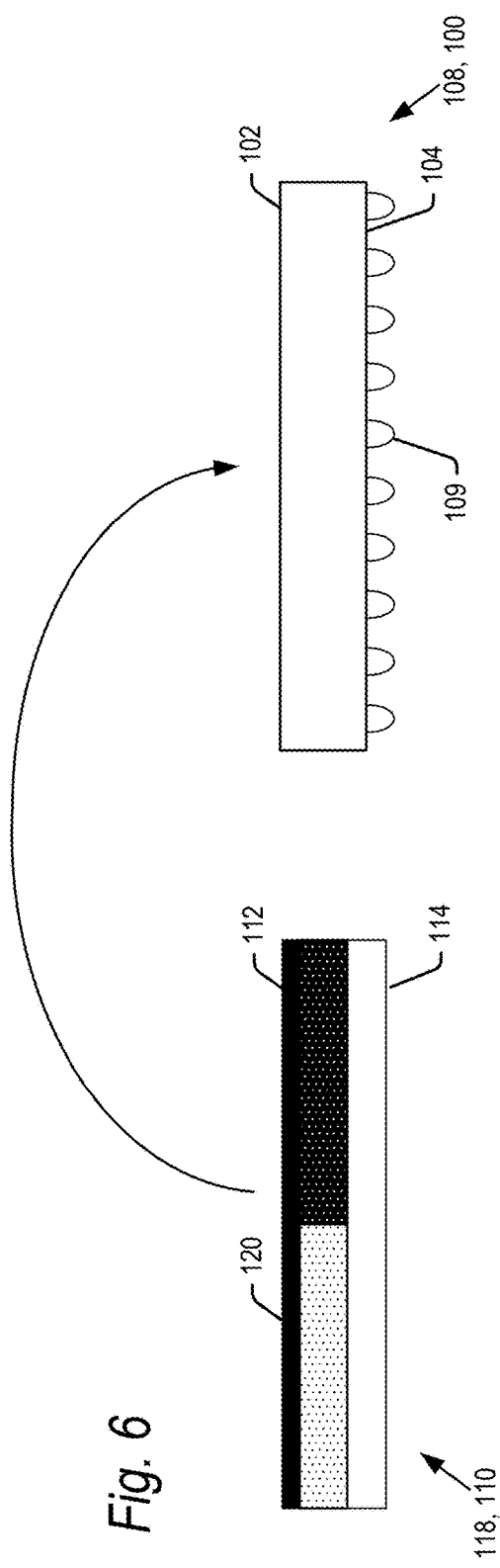
Figure 7:
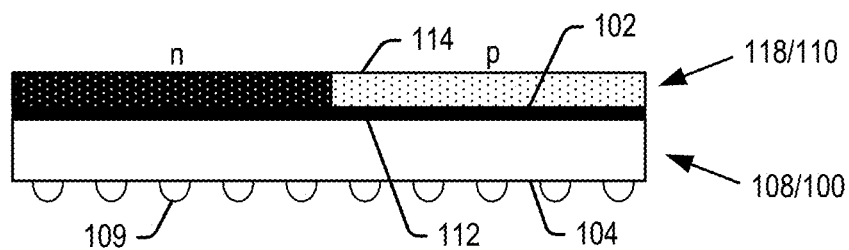

After formation of the first and second groups of dies 108, 118 in respective wafers 100, 110, the wafers may be joined to each other in step 220 as shown in FIG. 6. Wafer 110 may for example be flipped over and joined to wafer 100. Wafer 100 may have copper pads (not shown) on its first major surface, and the wafers may be joined using Cu-to-Cu bonding. Other bonding techniques are possible. The dies 118 may be of the same size as dies 108, and positioned in wafer 110 such that when the wafers are joined, dies 108 and 118 couple together as shown in the edge view of FIG. 7. Wafer mapping techniques may be used to ensure the dies 108 and 118 will align with each other when the wafer 110 is flipped and joined to wafer 100. It is conceivable that dies 118 may be slightly larger or smaller than dies 108 in further embodiments. In step 224, the exposed surface of the second wafer 110 may be thinned to a final thickness in a backgrind process as shown in FIG. 7. If not before the backgrind process, the thinned wafer 110 may be doped through its full thickness after the backgrind process. The final thickness of the second wafer may for example be 25 µm to 50 µm, though the final thickness may be greater or lesser than that in further embodiments. As shown in FIG. 7, the wafer 110 now has top major surface 114 (having been flipped over), and bottom major surface 112. Wafer 100 has top major surface 102 and bottom major surface 104.

Figure 8:
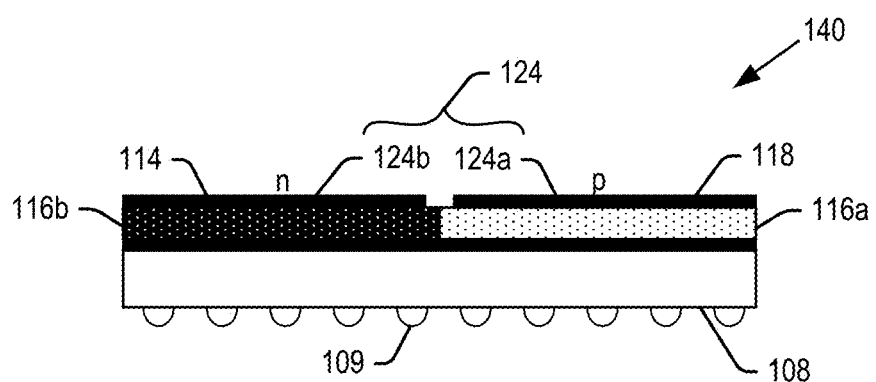
Figure 9:
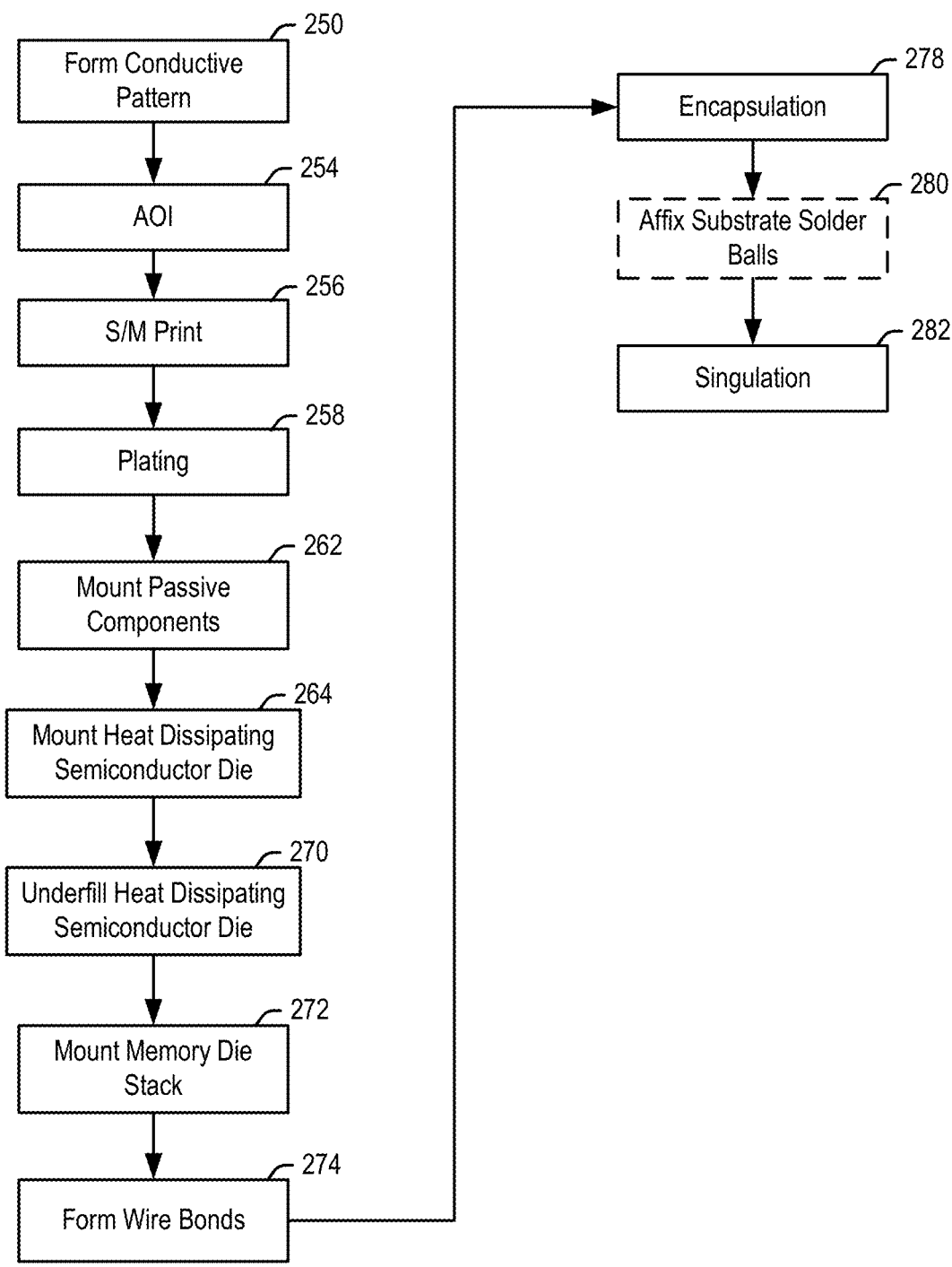
FIG. 9 is a flowchart for forming a thermoelectric semiconductor device using a heat dissipating semiconductor module according to embodiments of the present technology.

In step 226, a layer of copper 124 or other electrical and thermal conductor may be sputtered onto the top surfaces 114 of dies 118 of wafer 110 as shown in FIG. 8. The copper layer 124 may be sputtered so as to have first portion 124a over the p-doped region and second portion 124b on the n-doped region, with the first and second portions 124a, 124b being electrically isolated from each other.

Once layer 124 is formed on the top surface 114, the coupled semiconductor dies 108, 118 may be diced from each other in step 228. The dies 108, 118 may be diced using methods including sawing, lasing, stealth lasing, water jet cutting and other methods. The finished diced semiconductor dies 108, 118 (shown in FIG. 8) are referred to herein as a heat dissipating semiconductor module 140, or simply HDSM 140.

The HDSM 140 may be mounted on a substrate together with one or more memory dies to form a thermoelectric semiconductor device as will now be described with respect to the flowchart of FIG. 9 and the views of FIGS. 10-19. Although FIGS. 10-19 show an individual thermoelectric semiconductor device 150, or a portion thereof, it is understood that the device 150 may be batch processed along with a plurality of other thermoelectric semiconductor devices on substrate panels to achieve economies of scale. The number of rows and columns of devices 150 on the substrate panels may vary.

The substrate panel for the fabrication of thermoelectric semiconductor device 150 begins with a plurality of substrates 152 (again, one such substrate is shown in FIGS. 10-19). The substrate 152 may be a variety of different chip carrier mediums for transferring signals between semiconductor die(s) on the substrate and a host device. These chip carrier mediums include a printed circuit board (PCB), a leadframe or a tape automated bonded (TAB) tape. Where substrate 152 is a PCB, the substrate may be formed of a core sandwiched between a pair of conductive layers. The core may be formed of various dielectric materials such as for example, polyimide laminates, epoxy resins including FR4 and FR5, bismaleimide triazine (BT), and the like. The conductive layers may be formed of copper or copper alloys, plated copper or plated copper alloys, Alloy 42 (42Fe/58Ni), copper plated steel, or other metals and materials suitable for use on substrate panels.

Figure 10:
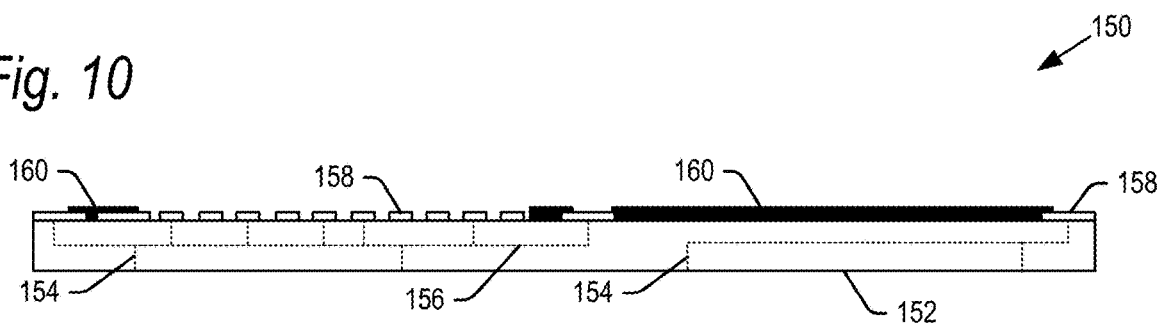
FIGS. 10-15 are edge views of the thermoelectric semiconductor device including the heat dissipating semiconductor module at various stages of fabrication according to embodiments of the present technology.
Figure 11:
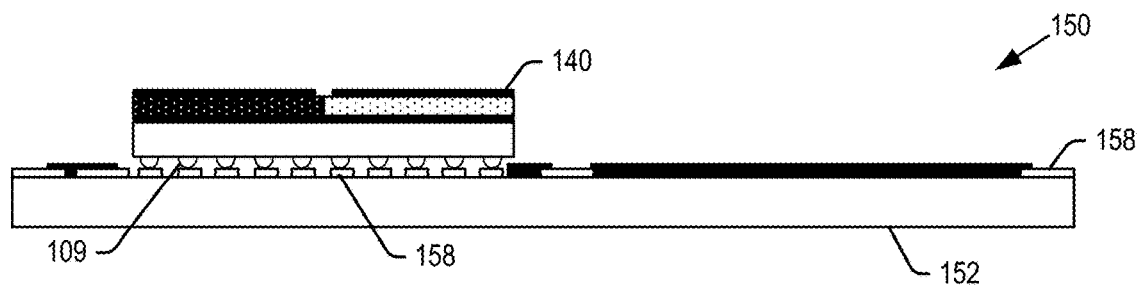

A conductive pattern of vias, leads and/or pads may be formed in step 250 in and through the substrate 152. The substrate 152 may drilled to define through-hole vias, which are subsequently plated and/or filled with a conductive metal. A conductance pattern of electrical traces and contact pads may then be formed on the top and/or bottom major planar surfaces of substrate 152. FIG. 10 illustrates an example of substrate 152 including vias 154, traces 156 and contact pads 158 formed on a first major planar surface of substrate 152. The pattern of vias 154, traces 156 and contact pad 158 shown on the surface of substrate 152 are by way of example, and the substrate 152 may include more or less vias, traces and/or contact pads in further embodiments, and they may be in different locations in further embodiments. The conductance pattern on the top and/or bottom surfaces of the substrate 152 may be formed by a variety of known processes, including for example various photolithographic processes.

Referring again to FIG. 9, the substrate 152 may next be inspected in step 254. This step may include an automatic optical inspection (AOI). Once inspected, a solder mask 160 may be applied to the upper and/or lower surfaces of the substrate 152 in step 256. After the solder mask is applied, the contact pads 158 and any other areas to be soldered may be plated in step 258, for example with a Ni/Au, Alloy 42, or the like, in a known electroplating or thin film deposition process.

Figure 12:
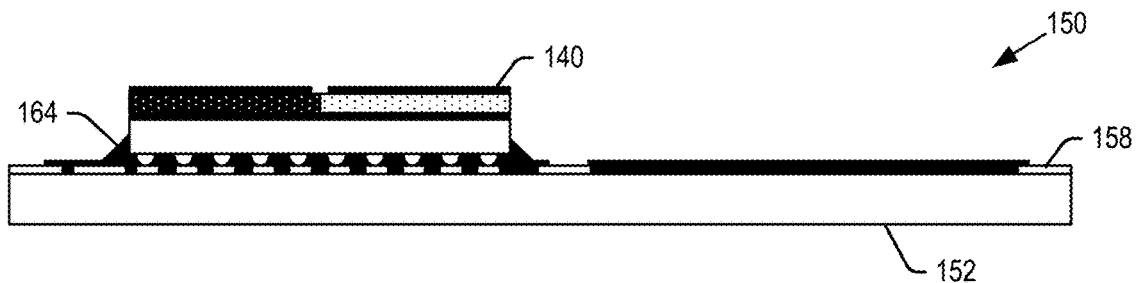

After an inspection, one or more passive components (not shown) may be mounted on the substrate 152 in step 262, including for example one or more capacitors, resistors and/or inductors, though other components are contemplated. In step 264, the HDSM 140 may be flip-chip mounted to the substrate as shown in the edge view of FIG. 11. The HDSM 140 may be physically and electrically coupled to the contact pads 158 using the bump bonds 109 on the bottom surface 104 of HDSM 140. In step 270, an underfill epoxy 164 may be injected or flowed beneath the HDSM 140 as shown in FIG. 12 to seal any space between the HDSM 140 and the substrate 152. The underfill step 270 may be omitted in further embodiments.

Figure 13:
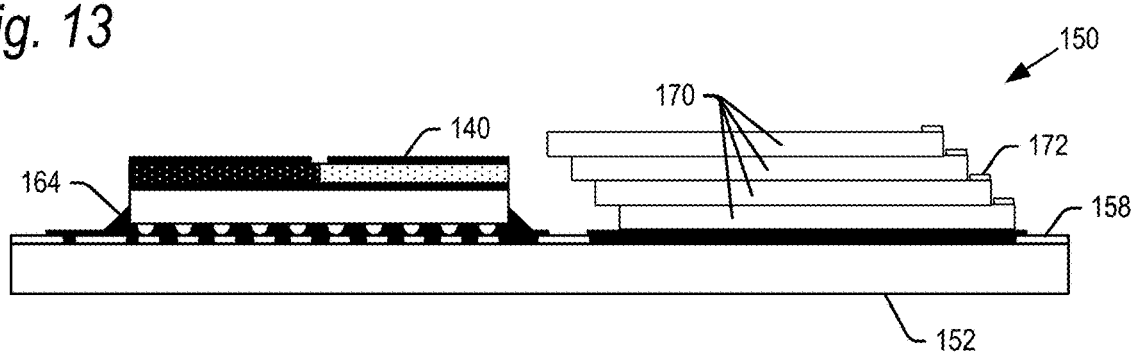

In step 272, one or more semiconductor dies 170 may be mounted on the substrate 152, as shown in the edge view of FIG. 13. The semiconductor dies 170 may for example be flash memory dies such as 2D NAND flash memory or 3D BiCS (Bit Cost Scaling), V-NAND or other 3D flash memory, but other types of dies 170 may be used. These other types of semiconductor dies include but are not limited to controller dies such as an ASIC, or RAM such as an SDRAM, DDR SDRAM, LPDDR and GDDR.

While four die are shown in FIG. 13, there may be different numbers of dies 170 in further embodiments, including for example 1, 2, 8, 16, 32, 64 or other numbers of dies. Each die 170 may include a number of die bond pads 172 along an edge of the semiconductor die (into the page of FIG. 13). The dies may be stepped offset so that the die bond pads 172 of one die 170 are left uncovered by the next die 170 mounted thereon. The dies 170 may be offset in the opposite direction, or a first group of dies 170 offset in a first direction, and a second group of dies 170 offset in the opposite direction, in further embodiments.

Figure 14:
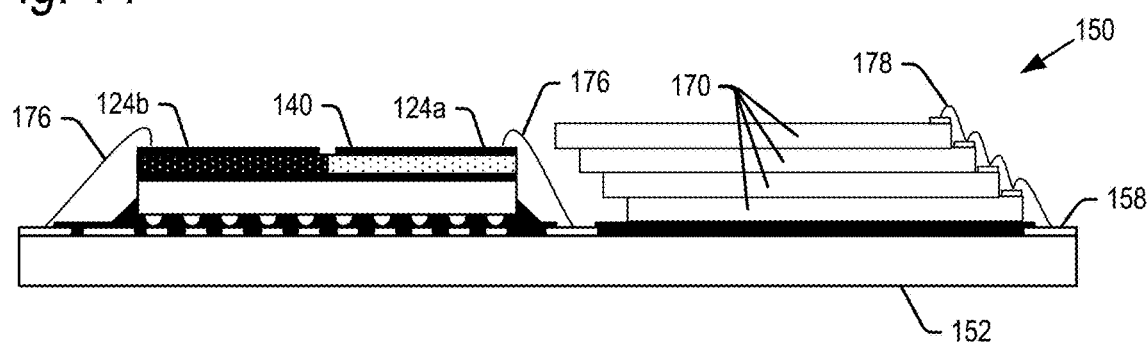

In step 274, the HDSM 140 may be electrically interconnected to the substrate using bond wires 176, and semiconductor dies 170 may be electrically interconnected to each other and to the substrate 152 using bond wires 178, as shown in FIG. 14. The bond wires 176, 178 may be formed using a variety of wire bond techniques. In one example, a wire bond capillary (not shown) may initially form balls on pads (not shown) of copper portions 124a, 124b using heat, ultrasonic energy and/or pressure. The capillary may then pay out wire 176 and form a wedge bond on the contact pads 158 of the substrate to electrically couple the thermoelectric semiconductor die 118 of the HDSM 140 to the substrate 152. As noted above, the first semiconductor die 108 of the HDSM 140 was electrically coupled to the substrate when flip-chip bonded to the substrate by bump bonds 109. Bond wires 178 may be formed down and across the die bond pads 172 in a similar manner to electrically couple the memory dies to each other and the substrate. Other wire bonding techniques may be used.

Figure 15:
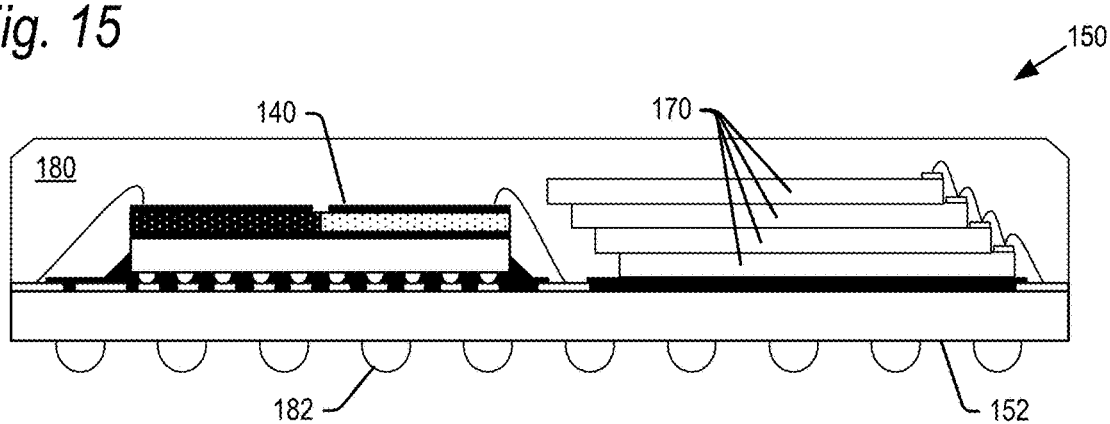

Following electrical connection of the HDSM 140 and the dies 170 to the substrate 152, the semiconductor device 150 may be encapsulated in a mold compound 180 in a step 278 and as shown in FIG. 15. Mold compound 180 may include for example solid epoxy resin, Phenol resin, fused silica, crystalline silica, carbon black and/or metal hydroxide. Other mold compounds from other manufacturers are contemplated. The mold compound may be applied by various known processes, including by compression molding, FFT (flow free thin) molding, transfer molding or injection molding techniques.

Where thermoelectric semiconductor device 150 is to be used as a BGA (Ball Grid Array) device, solder balls 182 may be affixed to the contact pads 158 on a lower surface of substrate 152 as shown in FIG. 15. The solder balls 182 may be used to solder the semiconductor device 150 to a host device, such as a printed circuit board (not shown). Where thermoelectric semiconductor device 150 is to be used as a LGA (Land Grid Array) device, the solder balls may be replaced by contact fingers on a lower surface of the substrate 152.

As noted above, the semiconductor device 150 may be formed on a panel of substrates. After formation and encapsulation of the semiconductor devices 150, the devices 150 may be singulated from each other in step 282 to form a finished semiconductor device 150 as shown in FIG. 15. The semiconductor devices 150 may be singulated by any of a variety of cutting methods including sawing, water jet cutting, laser cutting, water guided laser cutting, dry media cutting, and diamond coating wire cutting. While straight line cuts will define generally rectangular or square shaped semiconductor devices 150, it is understood that semiconductor device 150 may have shapes other than rectangular and square in further embodiments of the present technology.

The present technology provides a thermoelectric semiconductor device 150 including heat dissipation from a semiconductor die 108 within the device, and a method for fabricating same. Heat is dissipated from the semiconductor die 108 by the thermoelectric semiconductor die 118, which removes heat per the Seebeck effect (explained below with respect to FIGS. 16 and 17) and/or the Peltier effect (explained below with respect to FIGS. 18 and 19).

Figure 16:
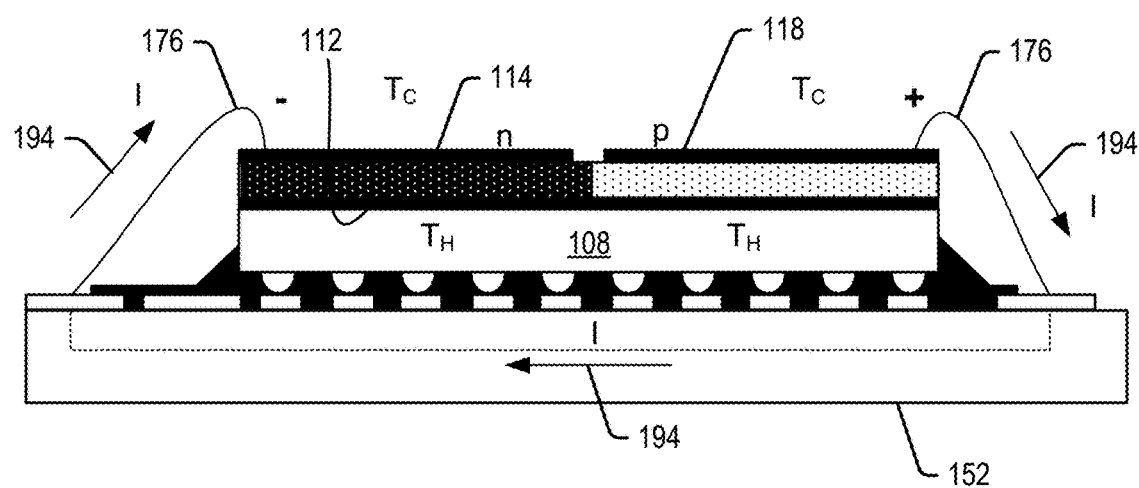
FIG. 16 is an edge view showing a portion of the thermoelectric semiconductor device including the heat dissipating semiconductor module operating per the Seebeck effect.
Figure 17:
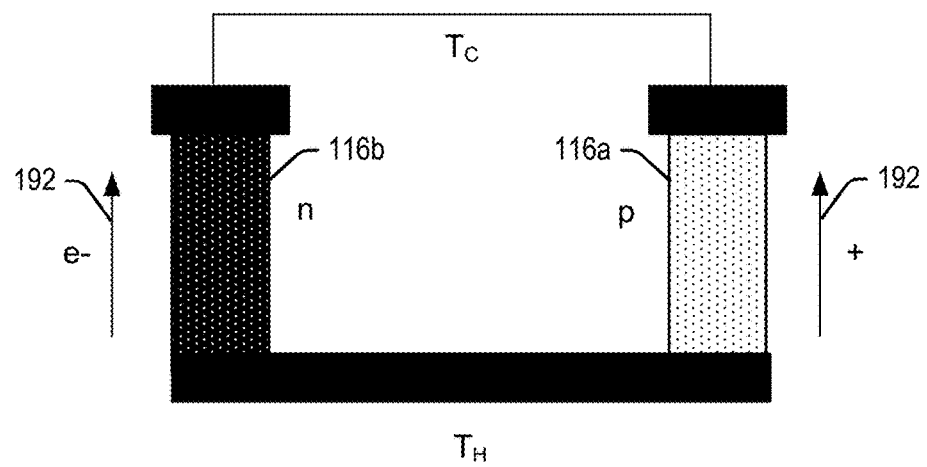
FIG. 17 is a schematic drawing of the heat dissipating semiconductor module of FIG. 16 operating per the Seebeck effect.

Referring initially to FIGS. 16 and 17, there is shown the HDSM 140 and a portion of the substrate 152 of device 150. As noted above, semiconductor die 108 may for example be a controller die, though it may be other types of dies in further examples. During operation, the die 108 will heat. As noted in the Background section, the heat generated by die 108 may damage the die 108 or other dies within device 150.

The thermoelectric semiconductor die 118 is thus provided to cool die 108. The heat from die 108 will heat the bottom surface 112 of the thermoelectric semiconductor die 118, thus creating a temperature gradient between the bottom surface 112 ($T_H$) and the top surface 114 ($T_C$). As indicated by the arrows 192 in FIG. 17, this temperature gradient ($T_H$–$T_C$) will cause a charge migration in p-n regions 116a and 116b from the hot surface of die 118 to the cold surface per the Seebeck effect. This charge migration will generate a current flow in the directions of arrows 194 in FIG. 16, through the bond wires 176 and conductors within substrate 152.

Under the principle of conservation of energy, this electrical energy is converted from thermal energy, i.e., heat from die 108 and at the bottom surface 112 of die 118. In this way, the thermoelectric die 118 draws heat from die 108 in this embodiment, resulting in cooling of the die 108. Heat drawn from die 108 per the Seebeck effect of this embodiment is referred to as passive heat dissipation, given that no external current is supplied to cool die 108.

Figure 18:
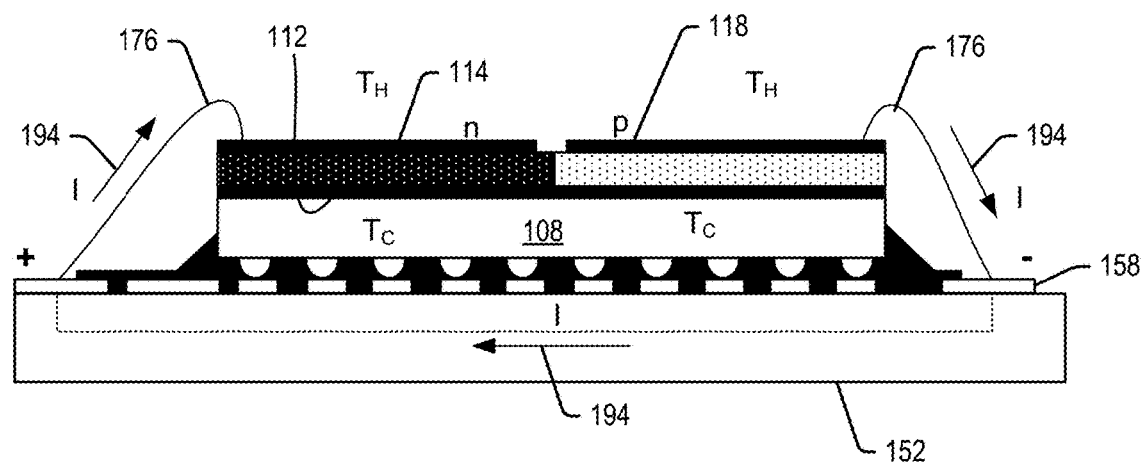
FIG. 18 is an edge view showing a portion of the thermoelectric semiconductor device including the heat dissipating semiconductor module operating per the Peltier effect.
Figure 19:
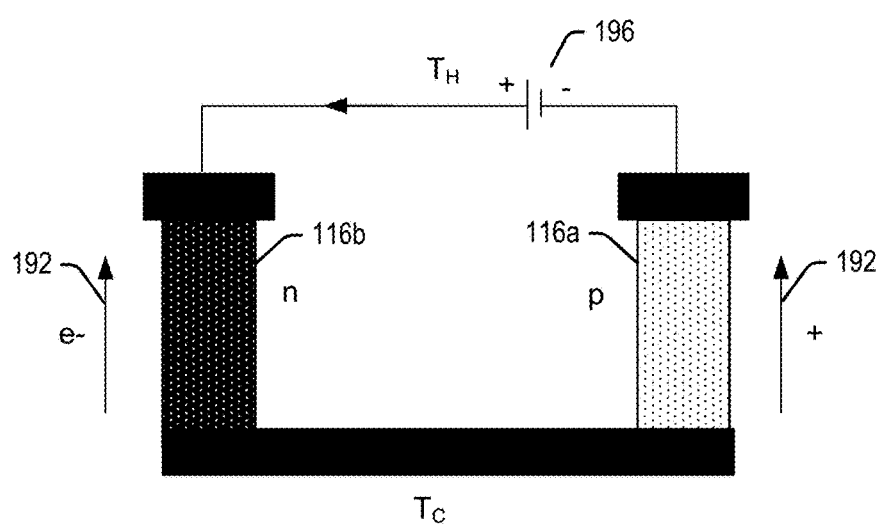
FIG. 19 is a schematic drawing of the heat dissipating semiconductor module of FIG. 18 operating per the Peltier effect.

Referring now to FIGS. 18 and 19, there is shown the HDSM 140 and a portion of the substrate 152 of device 150. This embodiment operates per the Peltier effect, and includes a current source 196 (FIG. 19) applied for example through a contact pad 158 of substrate 152. This current will cause a charge migration in the in p-n regions 116a and 116b from the bottom surface 114 to the top surface 112 of thermoelectric die 118. This charge migration will result in a temperature gradient between the top and bottom surfaces, as heat is carried away from the bottom surface 112 ($T_C$) toward the top surface 114 ($T_H$). This cooling of the bottom surface 112 in turn draws heat from the die 108, thus cooling the die 108. Bond wire 176 in may also transfer the heat from the top surface 114 ($T_H$) to a contact pad 158 of substrate 152, and then the heat will be transferred through thermal traces of the substrate 152 to dissipate in the ambient environment. Heat drawn from die 108 per the Peltier effect of this embodiment is referred to as active heat dissipation, given that cooling of die 108 is accomplished by application of an external current.

In summary, an example of the present technology relates to a method of forming heat dissipating semiconductor modules, comprising the steps of: forming a first group of semiconductor dies on a first wafer by the step of forming integrated circuits and metallization layers in a first major surface of the first wafer in areas defining the first group of semiconductor dies; forming a second group of semiconductor dies on a second wafer by the steps of: doping p-n regions at least in areas of the second wafer defining the second group of semiconductor dies, and forming an electrical conductor on a first major surface of the second wafer at least in the areas of the second wafer defining the second group of semiconductor dies; affixing the first and second semiconductor wafers together, the first group of semiconductor dies formed on the first wafer and the second group of semiconductor dies formed on the second wafer such that the first and second groups of semiconductor dies align with each other upon affixing the first and second semiconductor wafers together, respective pairs of aligned and connected first and second semiconductor dies from the first and second groups of semiconductor dies each forming a heat dissipating semiconductor module of the heat dissipating semiconductor modules; and dicing the heat dissipating semiconductor modules from the affixed first and second semiconductor wafers.

In a further example, the present technology relates to a method of forming heat dissipating semiconductor modules, comprising the steps of: forming a first group of semiconductor dies on a first wafer by the step of forming integrated circuits and metallization layers in a first major surface of the first wafer in areas defining the first group of semiconductor dies; forming a second group of semiconductor dies on a second wafer, the second group of semiconductor dies being thermoelectric semiconductor dies, by the step of doping p-n regions at least in areas of the second wafer defining the second group of semiconductor dies such that a temperature gradient or voltage potential between first and second surfaces of a semiconductor die of the second group of semiconductor dies results in migration of charge carriers between the first and second surfaces of the semiconductor die; affixing the first and second semiconductor wafers together, the first group of semiconductor dies formed on the first wafer and the second group of semiconductor dies formed on the second wafer such that the first and second groups of semiconductor dies align with each other upon affixing the first and second semiconductor wafers together, respective pairs of aligned and connected first and second semiconductor dies from the first and second groups of semiconductor dies each forming a heat dissipating semiconductor module of the heat dissipating semiconductor modules; and dicing the heat dissipating semiconductor modules from the affixed first and second semiconductor wafers.

In another example, the present technology relates to a method of forming a thermoelectric semiconductor device, comprising the steps of: attaching a heat dissipating semiconductor module to a substrate, the heat dissipating semiconductor module formed by affixing a first wafer comprising controller dies to a second wafer comprising thermoelectric semiconductor dies and dicing the first and second wafers such that the controller dies attach to the thermoelectric semiconductor dies to form a plurality of heat dissipating semiconductor modules including the heat dissipating semiconductor module; attaching one or more flash memory dies to the substrate; electrically coupling the heat dissipating semiconductor module to the substrate; and electrically coupling the one or more flash memory dies to the substrate.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of forming heat dissipating semiconductor modules, comprising the steps of:
    forming a first group of semiconductor dies on a first wafer by the step of forming integrated circuits and metallization layers in a first major surface of the first wafer in areas defining the first group of semiconductor dies;
    forming a second group of semiconductor dies on a second wafer, the second group of semiconductor dies being thermoelectric semiconductor dies, by the step of doping p-n regions at least in areas of the second wafer defining the second group of semiconductor dies such that a temperature gradient or voltage potential between first and second surfaces of a semiconductor die of the second group of semiconductor dies results in migration of charge carriers between the first and second surfaces of the semiconductor die; and
    the first and second groups of semiconductor dies on the first and second wafers formed such that the first group of semiconductor dies align with the second group of semiconductor dies upon joining of the first and second semiconductor wafers to form the heat dissipating semiconductor modules.

2. The method of claim 1, wherein said steps of forming the first and second groups of semiconductor dies further comprises the step of forming a semiconductor die from the first group to a same size as a semiconductor die of the second group.

3. The method of claim 1, wherein said step of forming the first group of semiconductor dies comprises the step of forming the first group of semiconductor dies into controller dies.

4. The method of claim 1, wherein said step of forming the group of second semiconductor dies comprises the step of configuring a second semiconductor die to have a voltage potential between first and second surfaces of the semiconductor die upon connecting the heat dissipating semiconductor module to an electrical circuit and heating of the first semiconductor die.

5. The method of claim 1, wherein said step of forming the second group of semiconductor dies comprises the step of configuring a semiconductor die of the second group to have a temperature gradient between first and second surfaces of the semiconductor die upon connecting the heat dissipating semiconductor module to an electrical circuit and running a current through the electrical circuit.

6. A method of forming a thermoelectric semiconductor device, comprising the steps of:
    receiving a first wafer including a group of first semiconductor dies, the first semiconductor dies comprising integrated circuits having metallization layers in a first major surface of the first wafer in areas defining the first group of semiconductor dies;
    receiving a second wafer including a group of second semiconductor dies, the second semiconductor dies comprising thermoelectric semiconductor dies formed by doping p-n regions at least in areas of the second wafer defining the second semiconductor dies such that a temperature gradient or voltage potential between first and second surfaces of a second semiconductor die results in migration of charge carriers between the first and second surfaces thereof; and
    joining the first and second semiconductor wafers, the first and second semiconductor dies on the first and second wafers being aligned, to form heat dissipating semiconductor modules.

7. The method of claim 6, further comprising the step of dicing the heat dissipating semiconductor modules.

8. The method of claim 7, further comprising the step of forming a first electrical conductor on a first major surface of the second wafer at least in the areas of the second wafer defining the group of second semiconductor dies.

9. The method of claim 8, further comprising the step of forming a second conductive layer on the second semiconductor wafer on a second major surface opposite the first major surface.

10. The method of claim 9, said step of forming the second conductive layer on the second major surface of the second semiconductor wafer occurring after said step of dicing the heat dissipating semiconductor modules from the affixed first and second semiconductor wafers.

11. The method of claim 6, further comprising the step of backgrinding a second major surface of the first semiconductor wafer, opposite the first major surface of the first semiconductor wafer, prior to affixing the first and second semiconductor wafers.

12. The method of claim 11, further comprising the step of forming bump bonds on the second major surface of the first semiconductor die after said step of backgrinding the second major surface of the first semiconductor die.

13. The method of forming a thermoelectric semiconductor device of claim 6, further comprising the steps of:

attaching a heat dissipating semiconductor module to a substrate;

electrically coupling the first semiconductor die of the heat dissipating semiconductor module to the substrate; and electrically coupling the second semiconductor die of the heat dissipating semiconductor module to the substrate.

14. The method of claim 13, wherein said step of electrically coupling the first semiconductor die to the substrate comprises the step of flip-chip bonding the first semiconductor die to a first set of contact pads on the substrate.

15. The method of claim 14, wherein said step of electrically coupling the second semiconductor die to the substrate comprises the step of wire bonding the second semiconductor die to a second set of contact pads on the substrate.

16. The method of claim 13, further comprising the step of attaching and electrically coupling one or more flash memory dies to the substrate.

17. The method of claim 16, wherein the one or more flash memory dies are stacked one upon another and the stack is positioned adjacent to the heat dissipating semiconductor module.

18. A method of forming a thermoelectric semiconductor device, comprising the steps of:

attaching a heat dissipating semiconductor module to a substrate, the heat dissipating semiconductor module formed by affixing a first wafer comprising controller dies to a second wafer comprising thermoelectric semiconductor dies and dicing the first and second wafer assembly such that the controller dies attach to the thermoelectric semiconductor dies to form a plurality of heat dissipating semiconductor modules including the heat dissipating semiconductor module, wherein the thermoelectric semiconductor die is doped with p-n regions such that a temperature gradient or voltage potential between first and second surfaces of the thermoelectric semiconductor die results in cooling of the controller die;

attaching one or more flash memory dies to the substrate adjacent to the heat dissipating semiconductor module;

electrically coupling the heat dissipating semiconductor module to the substrate; and electrically coupling the one or more flash memory dies to the substrate, wherein the substrate facilitates electrical communication between the controller die and the one or more flash memory dies.

19. The method of claim 18, said step of electrically coupling the heat dissipating semiconductor module to the substrate comprising the step of electrically coupling bump bonds on a surface of the controller die to contact pads on the substrate.

20. The method of claim 18, the contact pads comprising a first set of contact pads, said step of electrically coupling the heat dissipating semiconductor module to the substrate further comprising the step of electrically coupling a surface of the thermoelectric semiconductor die to a second set of contact pads on the substrate.

* * * * *